(12) United States Patent
Yakunin et al.

(10) Patent No.: US 9,007,565 B2
(45) Date of Patent: Apr. 14, 2015

(54) SPECTRAL PURITY FILTER

(75) Inventors: Andrei Mikhailovich Yakunin, Mierlo (NL); Vladimir Mihailovitch Krivtsun, Moscow Region (RU); Viacheslav Medvedev, Moscow (RU); Alexandre Kodentsov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 312 days.

(21) Appl. No.: 13/578,468

(22) PCT Filed: Dec. 8, 2010

(86) PCT No.: PCT/EP2010/069197
§ 371 (c)(1),
(2), (4) Date: Aug. 10, 2012

(87) PCT Pub. No.: WO2011/098170
PCT Pub. Date: Aug. 18, 2011

(65) Prior Publication Data
US 2012/0307224 A1   Dec. 6, 2012

Related U.S. Application Data

(60) Provisional application No. 61/304,115, filed on Feb. 12, 2010.

(51) Int. Cl.
*G03F 7/20* (2006.01)
*G02B 5/20* (2006.01)

(52) U.S. Cl.
CPC ........ *G03F 7/70191* (2013.01); *G03F 7/70916* (2013.01); *G03F 7/70958* (2013.01); *G02B 5/201* (2013.01); *G02B 5/208* (2013.01); *G03F 7/70575* (2013.01)

(58) Field of Classification Search
CPC .......... G02B 1/02; G02B 5/201; G02B 5/204; G02B 5/206; G02B 5/208; G03F 7/70033; G03F 7/70191; G03F 7/70575; G03F 7/70916; G03F 7/70233; G03F 7/70958; G03F 7/70175; G03F 7/70891
USPC ........... 250/504 R; 355/67, 71; 359/359–361; 977/932
See application file for complete search history.

(56) References Cited

U.S. PATENT DOCUMENTS 7,372,623 B2   5/2008   Banine et al.
2003/0173394 A1   9/2003   Cotton
(Continued)

FOREIGN PATENT DOCUMENTS

EP   0 578 109   1/1994
EP   1 491 652   12/2004
(Continued)

OTHER PUBLICATIONS

International Search Report for PCT International Patent Application No. PCT/EP2010/069197, mailed on May 17, 2011.
(Continued)

*Primary Examiner* — Colin Kreutzer
(74) *Attorney, Agent, or Firm* — Pillsbury Winthrop Shaw Pittman LLP

(57) ABSTRACT

A spectral purity filter includes a body of material, through which a plurality of apertures extend. The apertures are arranged to suppress radiation having a first wavelength and to allow at least a portion of radiation having a second wavelength to be transmitted through the apertures. The second wavelength of radiation is shorter than the first wavelength of radiation. The body of material is formed from tungsten-molybdenum alloy or a molybdenum-rhenium alloy or a tungsten-rhenium alloy or a tungsten-molybdenum-rhenium alloy.

17 Claims, 5 Drawing Sheets

(56) References Cited

U.S. PATENT DOCUMENTS

| | | |
|---|---|---|
| 2006/0048866 A1* | 3/2006 | Takada et al. .................. 148/423 |
| 2006/0146413 A1 | 7/2006 | Klunder et al. |
| 2006/0219958 A1* | 10/2006 | Wassink .................... 250/504 R |
| 2006/0243927 A1 | 11/2006 | Tran et al. |
| 2007/0170379 A1 | 7/2007 | Watson et al. |
| 2009/0045357 A1 | 2/2009 | Wassink |
| 2009/0239178 A1 | 9/2009 | Ikeda et al. |
| 2010/0020304 A1* | 1/2010 | Soer et al. ........................ 355/71 |
| 2013/0038926 A1* | 2/2013 | Soer et al. ..................... 359/350 |
| 2013/0114059 A1* | 5/2013 | Jak et al. ......................... 355/67 |

FOREIGN PATENT DOCUMENTS

| | | |
|---|---|---|
| JP | 2006-279036 | 10/2006 |
| JP | 2006-319328 | 11/2006 |
| JP | 2009-531854 | 9/2009 |
| WO | 2008/053881 | 5/2008 |
| WO | 2010/017890 A1 | 2/2010 |

OTHER PUBLICATIONS

Wouter A. Soer et al., "Grid spectral purity filters for suppression of infrared radiation in laser-produced plasma EUV sources," Proc. of SPIE, vol. 7271, pp. 72712Y-1-72712Y-9 (2009).

* cited by examiner

SPECTRAL PURITY FILTER

CROSS-REFERENCE TO RELATED APPLICATIONS

This application is the U.S. national phase entry of PCT/EP2010/069197, filed Dec. 8, 2010, which claims the benefit of priority from U.S. provisional application No. 61/304,115, which was filed on 12 Feb. 2010, the contents of both of which are incorporated herein in their entireties by reference.

FIELD

The present invention relates to a spectral purity filter, and for example a spectral purity filter suitable for use in a lithographic apparatus and/or a lithographic method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing (i.e. pattern application) can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print (i.e. apply) the pattern, $k_1$ is a process dependent adjustment factor, also called the Rayleigh constant, and CD is the feature size (or critical dimension) of the printed (i.e. applied) feature. It follows from equation (1) that reduction of the minimum printable (i.e. applicable) size of features can be obtained in three ways: by shortening the exposure wavelength $\lambda$, by increasing the numerical aperture NA or by decreasing the value of $k_1$.

In order to shorten the exposure wavelength and, thus, reduce the minimum printable (i.e. applicable) feature size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma (LPP) sources, discharge plasma (DPP) sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapour, such as Xe gas or Li vapour. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Practical EUV Sources, such those which generate EUV radiation using a plasma, do not only emit desired 'in-band' EUV radiation, but also undesirable 'out-of-band' radiation. This out-of-band radiation is most notably in the deep ultra violet (DUV) radiation range (100-400 nm). Moreover, in the case of some EUV sources, for example laser produced plasma EUV sources, the radiation from the laser, usually at 10.6 μm, presents a significant amount of out-of-band radiation.

In a lithographic apparatus, spectral purity is desired for several reasons. One reason is that resist is sensitive to out-of-band wavelengths of radiation, and thus the image quality of patterns applied to the resist may be deteriorated if the resist is exposed to such out-of-band radiation. Furthermore, out-of-band radiation infrared radiation, for example the 10.6 μm radiation in some laser produced plasma sources, leads to unwanted and unnecessary heating of the patterning device, substrate and optics within the lithographic apparatus. Such heating may lead to damage of these elements, degradation in their lifetime, and/or defects or distortions in patterns projected onto and applied to a resist-coated substrate.

In order to overcome these potential problems, several different transmissive spectral purity filters have been proposed which substantially prevent the transmission of infrared radiation, while simultaneously allowing the transmission of EUV radiation. Some of these proposed spectral purity filters comprise of a structure which is substantially opaque to, for example, infrared radiation, while at the same time being substantially transparent to EUV radiation. These and other spectral purity filters may also be provided with one or more apertures. The size and spacing of the apertures may be chosen such that infrared radiation is diffracted by the apertures (and thereby suppressed), while EUV radiation is transmitted through the apertures. A spectral purity filter provided with apertures may have a higher EUV transmittance than a spectral purity filter which is not provided with apertures. This is because EUV radiation will be able to pass through an aperture more easily than it would through a given thickness of solid material.

A typical spectral purity filter may be formed, for example, from a silicon foundation structure (e.g. a silicon grid, or other member, provided with apertures) that is coated with a reflective metal, such as molybdenum. In use, a typical spectral purity filter might be subjected to a high heat load from, for example, incident infrared and EUV radiation. The heat load might result in the temperature of the spectral purity filter being above 800° C. A typical spectral purity filter comprising of silicon coated with molybdenum has been found to have an unsatisfactorily short lifetime above 800° C. This is due to a reaction between the reflective molybdenum coating and the underlying silicon support structure, which results in eventual delamination of the coating. Delamination and degradation of the silicon foundation structure is accelerated by the presence of hydrogen, which is often used as a gas in the environment in which the spectral purity filter is used in order to suppress debris (e.g. debris, such as particles or the like), from entering or leaving certain parts of the lithographic apparatus.

In a lithographic apparatus (and/or method) it is desirable to minimize the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimize the amount of undesirable (e.g. out-of-band) radiation that is passing through the lithographic apparatus and which is incident upon the substrate. Furthermore, it is desirable to ensure that a spectral purity filter used in a lithographic method or apparatus has an adequate lifetime, and does not degrade rapidly over time as a consequence of the high heat load to which the spectral purity filter may be exposed, and/or the hydrogen (or the like) to which the spectral purity filter may be exposed. It is therefore desirable to provide an improved (or alternative) spectral purity filter, and for example a spectral purity filter suitable for use in a lithographic apparatus and/or method.

SUMMARY

According to an aspect of the present invention, there is provided a spectral purity filter, comprising: a body of material, through which a plurality of apertures extend; the apertures being arranged to suppress radiation having a first wavelength and to allow at least a portion of radiation having a second wavelength to be transmitted through the apertures, the second wavelength of radiation being shorter than the first wavelength of radiation; the body of material being formed from: a molybdenum-rhenium alloy, or a tungsten-rhenium alloy; or a tungsten-molybdenum alloy; or a tungsten-molybdenum-rhenium alloy.

The content of rhenium in the alloy, in atomic percentage, may be: 0.1% to 49% for the molybdenum-rhenium alloy; 0.1% to 27% for the tungsten-rhenium alloy; 0.1% to 49% for the tungsten-molybdenum-rhenium alloy.

The body of material may further comprise a plurality of nanoparticles for increasing a re-crystallization temperature of the body of material as a whole. The nanoparticles may comprise of one or more of: $Al_2O_3$, $HfO_2$, $ZrO_2$, $Y_2O_3$, MgO, La2O3, $Ce_2O_3$, SrO, HfC. The nanoparticles may be distributed in layers within the body of material.

A face of the body of material through which the apertures extend may comprise of, or may be provided with, a region or layer that is formed from substantially pure molybdenum or tungsten. The face may, in use, be configured to face toward incident radiation comprising the first wavelength and/or the second wavelength.

The first wavelength of radiation may have a wavelength that is in the infrared region of the electromagnetic spectrum, and/or the first wavelength is in the range of 9 μm-12 μm, for example about 9.4 μm or about 10.6 μm.

The second wavelength of radiation may have a wavelength that is substantially equal to or shorter than radiation having a wavelength in the EUV part of the electromagnetic spectrum, and/or the second wavelength is in the range of 5-20 nm, for example 13 nm-14 nm or 6 nm-7 nm, for instance about 6.6 nm to a about 6.9 nm.

According to an aspect of the present invention, there is provided a spectral purity filter, comprising: a body of material, through which a plurality of apertures extend; the apertures being arranged to suppress radiation having a first wavelength and to allow at least a portion of radiation having a second wavelength to be transmitted through the apertures, the second wavelength of radiation being shorter than the first wavelength of radiation; the body of material being formed from molybdenum, or from tungsten, and the body of material further comprising a plurality of nanoparticles for increasing a re-crystallization temperature of the body of material as a whole.

The nanoparticles may comprise of one or more of: $Al_2O_3$, $HfO_2$, $ZrO_2$, $Y_2O_3$, MgO, $La_2O_3$, $Ce_2O_3$, SrO, HfC.

The nanoparticles may be distributed in layers within the body of material.

The molybdenum may form part of a molybdenum-rhenium alloy; or a tungsten-molybdenum alloy; or a tungsten-molybdenum-rhenium alloy, or the tungsten may form part of a tungsten-rhenium alloy; or a tungsten-molybdenum alloy; or a tungsten-molybdenum-rhenium alloy. The content of rhenium in the respective alloy, in atomic percentage, may be: 0.1% to 49% for the molybdenum-rhenium alloy; 0.1% to 27% for the tungsten-rhenium alloy; 0.1% to 49% for the tungsten-molybdenum-rhenium alloy.

A face of the body of material through which the apertures extend may comprise of, or may be provided with, a region or layer that is formed from substantially pure molybdenum or tungsten. The face may, in use, be configured to face toward incident radiation comprising the first wavelength and/or the second wavelength.

The first wavelength of radiation may have a wavelength that is in the infrared region of the electromagnetic spectrum, and/or the first wavelength is in the range of 9 μm-12 μm, for example about 9.4 μm or about 10.6 μm.

The second wavelength of radiation may have a wavelength that is substantially equal to or shorter than radiation having a wavelength in the EUV part of the electromagnetic spectrum, and/or the second wavelength is in the range of 5 nm-20 nm, for example 13 nm-14 nm or 6 nm-7 nm, for instance 6.6 nm-6.9 nm.

According to an aspect of the present invention, there is provided a lithographic apparatus, or a radiation source, having the spectral purity filter of any of the aspects of the invention described herein.

According to an aspect of the invention, there is provided a lithographic apparatus that includes a spectral purity filter configured to filter radiation comprising a first wavelength and a second wavelength. The spectral purity filter includes a body of material, through which a plurality of apertures extend. The apertures are arranged to suppress radiation having a first wavelength and to allow at least a portion of radiation having a second wavelength to be transmitted through the apertures, the second wavelength of radiation being shorter than the first wavelength of radiation. The body of material is formed from a tungsten-molybdenum alloy or a molybdenum-rhenium alloy or a tungsten-rhenium alloy or a tungsten-molybdenum-rhenium alloy. The apparatus includes a support constructed and arranged to support a patterning device, the patterning device being configured to pattern the radiation having the second wavelength, and a projection system configured to project the patterned radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
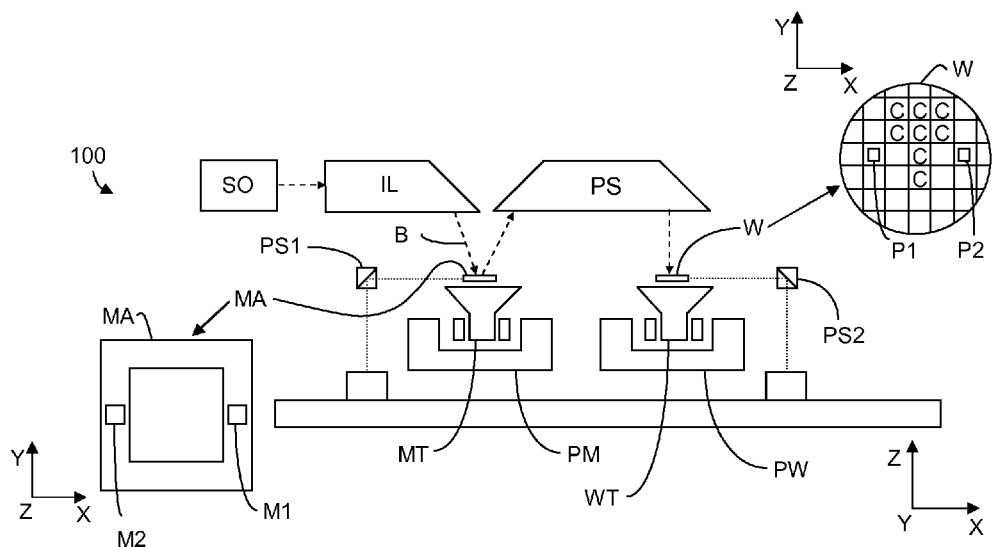
FIG. 1 schematically depicts a lithographic apparatus according to an embodiment of the invention.

FIG. 1 schematically depicts a lithographic apparatus 100 including a source collector module SO according to one embodiment of the invention. The apparatus comprises: an illumination system (sometimes referred to as an illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device MA; a substrate table (e.g. a wafer table) WT constructed to hold a substrate (e.g. a resist-coated wafer) W and connected to a second positioner PW configured to accurately position the substrate W; and a projection system (e.g. a reflective projection system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illumination system IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma (LPP), the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illumination system IL may comprise an adjuster for adjusting the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously (e.g. in the X or Y direction) while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
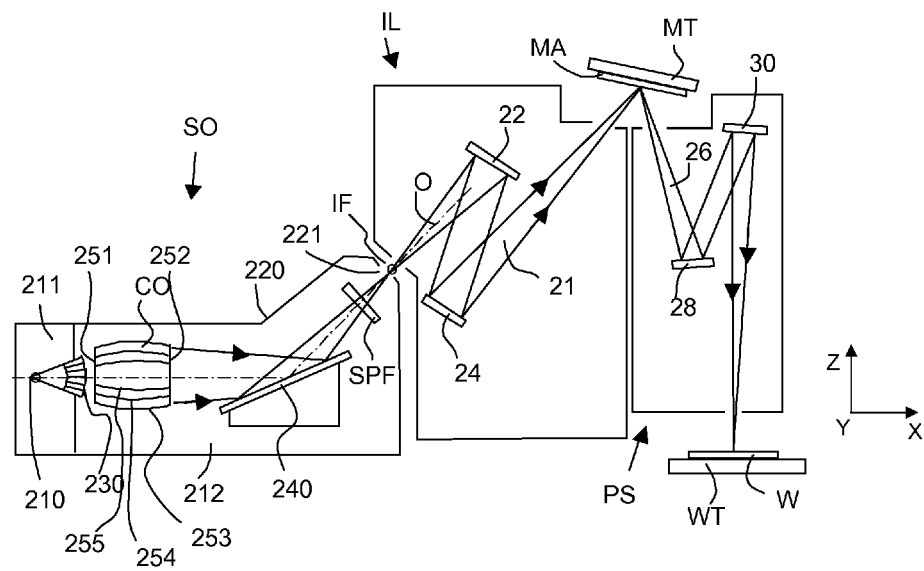
FIG. 2 is a more detailed view of the lithographic apparatus shown in FIG. 1, including a discharge produced plasma (DPP) source collector module SO.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma (DPP) source. EUV radiation may be produced by a gas or vapour, for example Xe gas, Li vapour or Sn vapour in which the (very hot) plasma 210 is created to emit radiation in the EUV range of the electromagnetic spectrum. The (very hot) plasma 210 is created by, for example, an electrical discharge creating an at least partially ionized plasma. Partial pressures of, for example, 10 Pa of Xe, Li, Sn vapour or any other suitable gas or vapour may be required for efficient generation of the radiation. In an embodiment, a plasma of excited tin (Sn) is provided to produce EUV radiation.

The radiation emitted by the plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210. Before passing through the opening 221, the radiation may pass through an optional spectral purity filter SPF. In other embodiments, the spectral purity filter SPF may be located in a different part of the lithographic apparatus (e.g. outside of the source collector module SO). Embodiments of a spectral purity filter are described in more detail below.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more reflective elements (e.g. mirrors or the like) present than those shown in the Figures, for example there may be 1-6 additional reflective elements present in the projection system PS than shown in FIG. 2.

Collector CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector CO of this type is preferably used in combination with a discharge produced plasma source, often called a DPP source.

Figure 3:
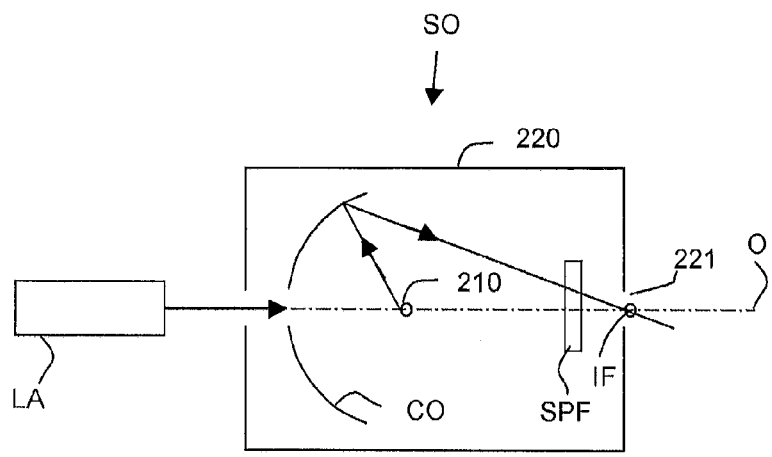
FIG. 3 is a view of an alternative source collector module SO of the apparatus of FIG. 1, the alternative being a laser produced plasma (LPP) source collector module.

Alternatively, the source collector module SO may be part of, comprise or form an LPP radiation system as shown in FIG. 3. Referring to FIG. 3, a laser LA is arranged to deposit laser energy into a fuel, such as a droplet or region or vapour of xenon (Xe), tin (Sn) or lithium (Li), creating the highly ionized plasma 210 with electron temperatures of several 10's of eV. The energetic radiation generated during de-excitation and recombination of these ions is emitted from the plasma 210, collected by a near normal incidence collector CO and focused onto the opening 221 in the enclosing structure 220. Before passing through the opening 221, the radiation may pass through an optional spectral purity filter SPF. In other embodiments, the spectral purity filter SPF may be located in a different part of the lithographic apparatus (e.g. outside of the source collector module SO). Embodiments of a spectral purity filter are described in more detail below.

It is known to use a spectral purity filter in a lithographic apparatus to filter out undesirable (e.g. out-of-band) wavelength components of a radiation beam. For instance, it is known to provide a spectral purity filter comprising one or more apertures. The diameter of, and/or spacing between the apertures is chosen such that the apertures suppress one or more undesirable wavelengths of radiation (i.e. radiation having a first wavelength, such as infrared radiation) by diffraction or scattering or the like, while allowing one or more desirable wavelengths of radiation (i.e. radiation having a second wavelength, such as EUV radiation) to pass through the apertures. For instance, the undesirable radiation may comprise infrared radiation which might heat and possible damage or deform the spectral purity filter, whereas the desirable radiation may comprise EUV or beyond EUV radiation that may be used to apply patterns to a resist coated substrate.

Figure 4:
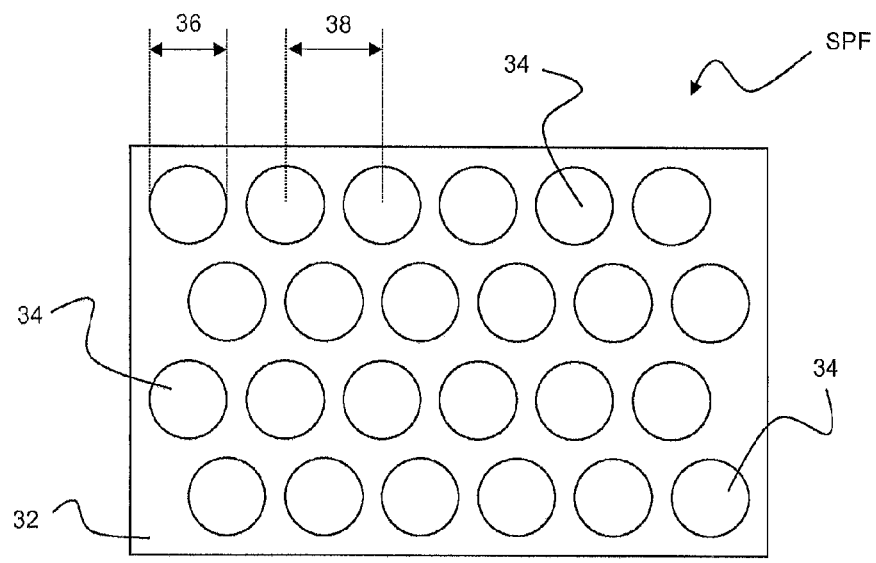
FIG. 4 schematically depicts a transmissive spectral purity filter.

FIG. 4 schematically depicts a spectral purity filter SPF (not in accordance with the present invention). The spectral purity filter SPF comprises of a body of material in the form of a planar member 32 (discussed in more detail below) in which a periodic array of circular apertures 34 is provided. The diameter 36 of the apertures 34, and/or a spacing 38 between the apertures 34, is selected such that a first wavelength of radiation to be suppressed is substantially diffracted at the entrance of, and/or within, each aperture 34, while radiation of a second, shorter wavelength is transmitted through the apertures 34. The diameter 36 of the apertures 34 may be, for example, in the range of 1 μm-100 μm, in order to suppress by diffraction radiation having a comparable wavelength (e.g. infrared radiation), while allowing radiation of a shorter wavelength (e.g. EUV radiation) to pass through the apertures 34.

The planar member 32 may be substantially opaque to the first wavelength of radiation or range of wavelengths which the spectral purity filter SPF is designed to suppress. For instance, the planar member 32 may reflect or absorb the first wavelength, for example a wavelength in the infrared range of the electromagnetic spectrum. The planar member 32 may also be substantially opaque to one or more second wavelengths of radiation which the spectral purity filter SPF is designed to transmit, for example a wavelength in the EUV range of the electromagnetic spectrum. However, the spectral purity filter SPF can also be formed from a planar member 32 which is substantially transparent to the one or more first wavelengths that the spectral purity filter SPF is designed to transmit. This may increase the transmittance of the spectral purity filter SPF with respect to the one or more wavelengths which the spectral purity filter SPF is designed to transmit.

The apertures 34 in the spectral purity filter SPF are arranged in a hexagonal pattern. This arrangement is preferred, since it gives the closest packing of circular apertures, and therefore the highest transmittance for the spectral purity filter SPF. However, other arrangements of the apertures are also possible, for example square, and rectangular or other periodic or aperiodic arrangements may be used. For instance, in the case of a periodic array, a random pattern may be employed. The apertures (in whatever arrangement) may be circular in shape, or, for example, elliptical, hexagonal, square, rectangular, or any other suitable shape.

Figure 5:
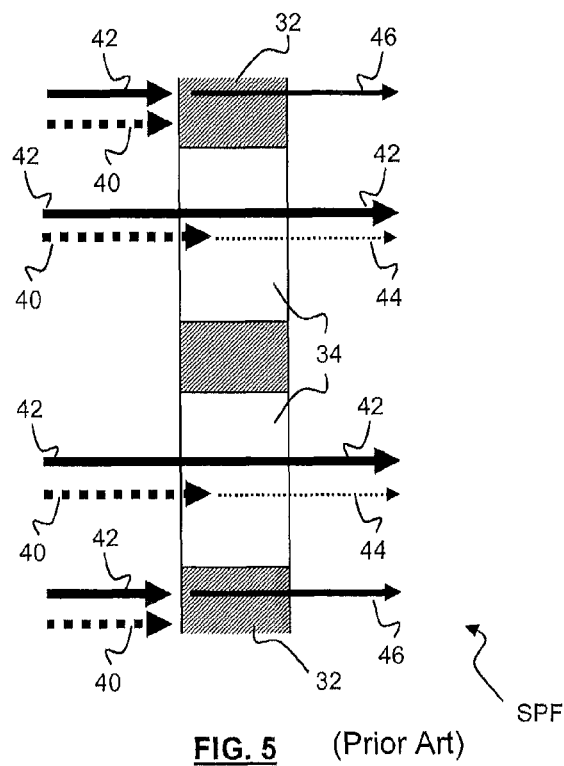
FIG. 5 schematically depicts a side-on and part-section view of the spectral purity filter of FIG. 4, together with radiation incident on the spectral purity filter.

FIG. 5 schematically depicts the spectral purity filter SPF of FIG. 4 in a side-on and part-section view. FIG. 5 further depicts radiation having a first wavelength 40 (e.g. infrared radiation) and radiation having a second, shorter, wavelength 42 (e.g. EUV radiation). The radiation 40, 42 constitutes radiation from a beam of radiation (e.g. the beam of radiation discussed above in relation to FIGS. 1 to 3). Radiation having a first wavelength 40 and radiation having a second wavelength 42 is incident upon the spectral purity filter SPF.

When radiation having a first wavelength 40 and radiation having a second wavelength 42 is directed toward an aperture 34 of the spectral purity filter SPF, the radiation having the first wavelength 40 is diffracted by the apertures 34 and is substantially suppressed from being transmitted through the spectral purity filter SPF. Only a small percentage of radiation having a first wavelength 40 is transmitted 44 through the apertures 34. Radiation having a second wavelength 42 readily passes through the apertures 34 of the spectral purity filter SPF. This is because the radiation having a second wavelength 42 is not substantially diffracted and suppressed by the apertures 34.

When radiation having a first wavelength 40 and radiation having a second wavelength 42 is directed toward a solid part of the planar member 32 forming the spectral purity filter SPF, the radiation having the first wavelength 40 is reflected or absorbed by the solid part of the planar member 32, and is thereby suppressed from being transmitted through the spectral purity filter SPF. This is because the planar member 32 is not transmissive with respect to the radiation having the first wavelength 40. Radiation having a second wavelength 42 is substantially transmitted 46 through the solid part of the planar member 32 of the spectral purity filter SPF. This is because the planar member 32 is substantially transmissive with respect to the radiation having the first wavelength 40.

FIG. 5 shows that only a small amount of radiation having the first wavelength 40 is able to pass through 44 the spectral purity filter SPF, whereas in contrast a much larger portion of radiation having the second wavelength 42 is able to pass through 42, 46 the spectral purity filter.

Figure 6:
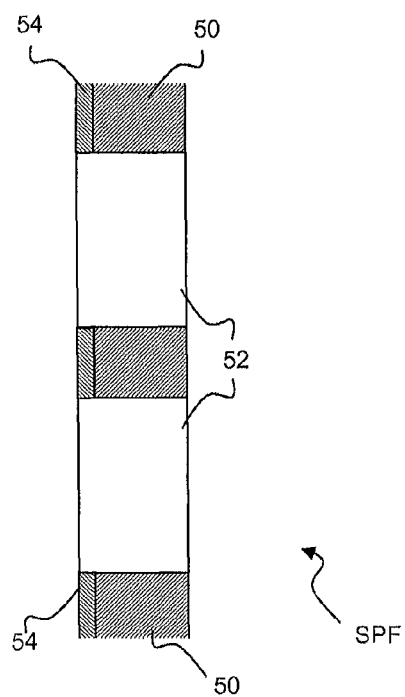
FIG. 6 schematically depicts a more detailed or alternative side-on and part-section view of the spectral purity filter of FIGS. 4 and 5.

FIG. 6 is a side-on and part-section view of a typical spectral purity filter SPF (not in accordance with an embodiment of the present invention). The spectral purity filter SPF depicted may be, for example, a more detailed representation of a spectral purity filter SPF described in relation to FIGS. 4 and 5.

The spectral purity filter SPF comprises of a silicon foundation structure 50. The silicon foundation structure comprises (e.g. is provided in a previous processing step) with a plurality of apertures 42 configured as discussed above to suppress radiation having a certain wavelength, for example by diffraction or the like. Silicon is chose as the foundation material since silicon may be easily worked with in a lithographic process or the like. The silicon foundation structure 50 (which may be referred to as a silicon grid or a silicon grating or the like) is provided with a molybdenum coating 54. The molybdenum coating 54 is provided to reflect infrared radiation that is incident on the spectral purity filter SPF, and thus reduce the heat load on, and temperature of, the spectral purity filter SPF as a whole. In the Figure, the molybdenum coating 54 is shown as being located on a single face of the silicon support structure 50, for instance the face that will face towards incident radiation. In other embodiments, the molybdenum coating may coat more regions or faces of the silicon foundation structure.

During use of the spectral purity filter SPF, even with the presence of the reflective molybdenum coating 54, the spectral purity filter SPF may be subjected to a high heat load (e.g.

in excess of 800° C.) and for a prolonged period of time. It has been found that such a spectral purity filter SPF has an inadequate and insufficient lifetime above 800° C. This is due to a reaction between the reflective molybdenum coating 54 and the underlying silicon foundation structure 50, which results in eventual delamination of the molybdenum coating 54. Spectral purity filters are often used in the presence of hydrogen. This is because hydrogen is often used as a debris suppressant, for example to suppress the passage of debris between different parts of a lithographic apparatus or to prevent debris from being incident upon the spectral purity filter. In the presence of hydrogen, however, delamination and thus degradation of the silicon foundation structure 50 has been found to be accelerated, further reducing the lifetime of the spectral purity filter SPF.

It is desirable to provide a spectral purity filter which is more resilient to the temperatures that such a filter might be subjected to during typical use of the filter, and for example in the presence of hydrogen.

In accordance with an embodiment of the present invention, material solutions have been found to the potential problems discussed above. In accordance with an embodiment of the invention, there is provided a spectral purity filter which comprises of a body of material through which a plurality of apertures extend. As with a typical existing spectral purity filter, the apertures are arranged to suppress radiation having a first wavelength (e.g. by diffraction or the like) and to allow at least a portion of radiation having a second, shorter, wavelength to be transmitted through the apertures. For example, the first wavelength of radiation may be or comprise infrared radiation, for example, radiation having a wavelength of 9 µm-12 µm, for example about 9.4 µm or about 10.6 µm. The second wavelength of radiation may be, for example, radiation having a wavelength in the EUV part of the electromagnetic spectrum, for example radiation having a wavelength in the range of 5 nm-20 nm, for example 13 nm-14 nm or 6 nm-7 nm, for instance 6.6 nm-6.9 nm. The body of material may be formed from a molybdenum-rhenium alloy, or a tungsten-rhenium alloy, or a tungsten-molybdenum-rhenium alloy. Such alloys are more ductile and have a higher re-crystallization temperature than either pure molybdenum or pure tungsten, meaning that a spectral purity filter formed from such alloys is more durable and has a longer lifetime than a typical spectral purity filter as discussed above. An alternative alloy might be a tungsten-molybdenum alloy, which still performs better than a known metal coated, and silicon based spectral purity filter. Furthermore, such alloys are not known to be reactive with hydrogen, allowing a spectral purity filter formed from such alloys to be used in a hydrogen rich atmosphere with little or no risk of degradation resulting from the presence of hydrogen.

According to an embodiment of the invention, there is provided a spectral purity filter comprising a body of material through which a plurality of apertures extend. As with the previously described aspect of the invention, the apertures are arranged to suppress radiation having a first wavelength (e.g. by diffraction or the like) and to allow at least a portion of radiation having a second, shorter wavelength to be transmitted through the apertures. For example, the first wavelength of radiation may be or comprise infrared radiation, for example, radiation having a wavelength of 9 µm-12 µm, for example about 9.4 µm or about 10.6 µm. The second wavelength of radiation may be, for example, radiation having a wavelength in the EUV part of the electromagnetic spectrum, for example radiation having a wavelength in the range of 5 nm-20 nm, for example 13 nm-14 nm or 6 nm-7 nm, for instance 6.6 nm-6.9 nm. In this embodiment of the invention, the body of material is formed from molybdenum, or from tungsten. Furthermore, the body of material further comprises a plurality of nanoparticles for increasing a re-crystallization temperature of the body of material that forms the spectral purity filter, as a whole. By increasing the re-crystallization temperature, the body of material and thus the spectral purity filter as a whole is more resilient to prolonged use at high temperatures. Again, the use of molybdenum or tungsten results in a body of material, and thus a spectral purity filter, which is unreactive with respect to hydrogen, and this allows the spectral purity filter to be used in a hydrogen rich environment.

In both above-described embodiments of the invention, the apertures of the spectral purity filter are described as being arranged to suppress radiation having a first wavelength and to allow at least a portion of radiation having a second, shorter wavelength to be transmitted through the apertures. Typical examples of such arrangements will not be discussed in detail herein, since such arrangements are known in the art and are not the subject of the present invention. Instead, the materials forming the spectral purity filter are the focus of the present invention, and embodiments will be described in more detail below in relation to FIGS. 7-10. In FIG. 7-10, the Figures have not been drawn to any particular scale, and are given by way of example only.

Figure 7:
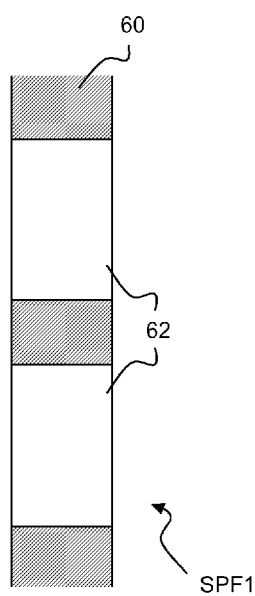
FIG. 7 schematically depicts a side-on and part-section view of a spectral purity filter in accordance with a first embodiment of the present invention.

FIG. 7 schematically depicts a side-on and part-section view of a spectral purity filter SPF1 in accordance with an embodiment of the present invention. The spectral purity filter SPF1 comprises (or is formed from) a body of material 60 through which a plurality of apertures 62 extend. The apertures may be provided using drilling or the like, or in any other manner. The apertures 62 are arranged to suppress radiation having a first wavelength (e.g. by diffraction or the like) and to allow at least a portion of radiation having a second, shorter wavelength to be transmitted through the apertures 62. The body of material 60 may be formed from a molybdenum-rhenium alloy. In another example, the body of material may be formed from a tungsten-rhenium alloy, or from a tungsten-molybdenum-rhenium. Either alloy is more ductile and has a higher re-crystallization temperature than pure molybdenum or pure tungsten, and can function for a longer period of time at a higher temperature than a typical (existing) silicon and molybdenum based spectral purity filter. In yet another example, the body of material may be formed from a tungsten-molybdenum alloy, which can also function for a longer period of time at a higher temperature than a typical (existing) silicon and molybdenum based spectral purity filter.

If the body of material 60 is formed from a molybdenum-rhenium alloy, the content of rhenium in the alloy, in atomic percentage, may be about 0.1% to about 49%. If the body of material is formed from a tungsten-rhenium alloy, the content of rhenium in the alloy, in atomic percentage, may be about 0.1% to about 27%. If the body of material 60 is formed from a tungsten-molybdenum-rhenium alloy, the content of rhenium in the alloy, in atomic percentage, may be about 0.1% to about 49%.

Figure 8:
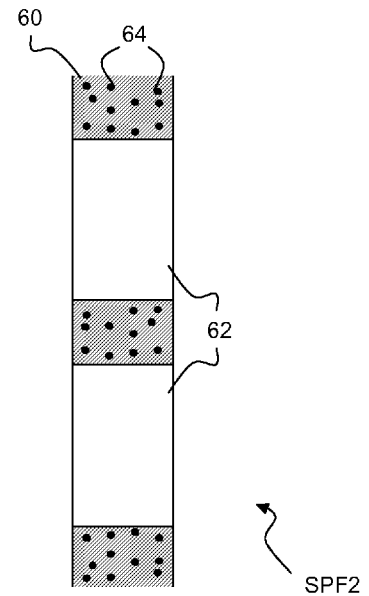
FIG. 8 schematically depicts a side-on and part-section view of a spectral purity filter in accordance with a second embodiment of the present invention.

FIG. 8 schematically depicts another embodiment of a spectral purity filter SPF2. A molybdenum-rhenium alloy, or a tungsten-rhenium alloy, or a tungsten-molybdenum-rhenium alloy, a tungsten-molybdenum alloy forms the body of material 60. The spectral purity filter SPF2 comprises apertures 62 as previously discussed for suppression of radiation having a first wavelength, and for the transmission of radiation having a second, shorter wavelength. A difference between this embodiment of the spectral purity filter SPF2, and the spectral purity filter of FIG. 7 is that in the spectral purity filter of SPF2, the body of material 60 is further provided with a plurality of nanoparticles 64 for increasing a re-crystallization temperature of the body of material 60 as a whole and thus improving the temperature resilience of the spectral purity filter SPF2. The nanoparticles may comprise one or more of: $Al_2O_3$, $HfO_2$, $ZrO_2$, $Y_2O_3$, MgO, La2O3, $Ce_2O_3$, SrO, HfC. The nanoparticles 64 may, in an embodiment, be distributed in the body of material 60 in the form of one or more layers. For instance, in the formation of the spectral purity filter SPF2 an amount of an alloy may be deposited, followed by a layer of nanoparticles, followed by an amount of alloy, and so on until the body of material and spectral purity filter is formed. The provision of nanoparticles in the form of layers may be easier to implement than an alternative distribution, for example where the nanoparticles are uniformly distributed throughout the body of material.

In other embodiments of a spectral purity filter (not shown), nanoparticles may be provided (for example, in the form of one or more layers) in the body of material comprising substantially pure tungsten or pure molybdenum or an alloy of tungsten and molybdenum (i.e. there being no presence of rhenium). The lack of rhenium may mean that the body of material and the spectral purity filter as a whole is not as ductile as a spectral purity filter comprising a molybdenum-rhenium alloy or a tungsten-rhenium alloy. However, the presence of the nanoparticles will still increase the re-crystallization temperature of the spectral purity. By increasing the re-crystallization temperature, the body of material and thus the spectral purity filter as a whole may be more resilient to prolonged use at high temperatures in comparison with a typical silicon and molybdenum based spectral purity filter, as discussed above.

Figure 9:
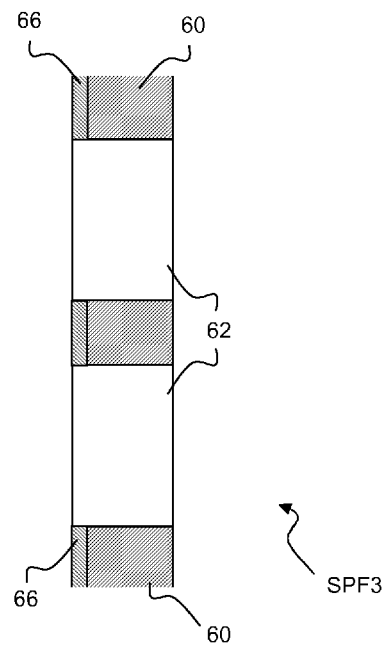
FIG. 9 schematically depicts a side-on and part-section view of a spectral purity filter in accordance with the third embodiment of the present invention.

The function of the spectral purity filter is to substantially suppress radiation having a first wavelength, for example infrared radiation, and to allow (through the apertures or through the body of material forming the spectral purity filter) the transmission or passage of radiation having a second, shorter wavelength. Suppression of the radiation having the first wavelength may be via diffraction of radiation at the opening of the apertures and within the apertures, and/or from reflection of that radiation from the spectral purity filter itself. Pure tungsten and molybdenum are known, for example, to have a certain reflectivity with respect to infrared radiation (for example, 10.6 µm radiation). However, tungsten-rhenium alloys, and molybdenum-rhenium alloys, are known to have lower reflectivities than pure molybdenum or tungsten. It is desirable to be able to provide a spectral purity filter which is resilient to prolonged use at high temperatures, but which does not suffer from a reduction (or a substantial reduction) in reflectivity of radiation which the spectral purity filter is designed to suppress and/or reflect. FIG. 9 shows how a balance can be struck which results in these desired specifications being met.

FIG. 9 schematically depicts a spectral purity filter SPF3 according to a third embodiment of the present invention. The spectral purity filter SPF3 is in many ways similar to the spectral purity filter shown in and described with reference to FIG. 7. Referring back to FIG. 9, the spectral purity filter SPF3 comprises of a body of material 60 through which a plurality of apertures extend. The apertures 62 are again arranged to suppress radiation having a first wavelength, and to allow at least a portion of radiation having a second, shorter wavelength to be transmitted through the apertures. The body of material 60 is formed from a molybdenum-rhenium alloy, or a tungsten-rhenium alloy, or a tungsten-molybdenum-rhenium alloy. As discussed above, such alloys have a reduced reflectivity with respect to, for example, infrared radiation at 10.6 µm than pure tungsten or pure molybdenum.

To overcome this potential problem, a face of the body of material 60 through which the apertures 62 extend comprises of, or is provided with, a region or layer that is formed from substantially pure molybdenum or tungsten 66, or from an alloy of molybdenum and tungsten. In other embodiments, a separate layer may not be provided on a face of the body of material. For instance, the body of material can be formed in such a way that the body of material comprises an alloy for a part of body and then, in a region approaching and including a face of the body of material, the processing or manufacture of the body of material may be such that the material is no longer an alloy but is pure molybdenum or tungsten, or an alloy of molybdenum and tungsten not containing rhenium.

In use, the face provided with the layer (or comprising the region of) substantially pure molybdenum or tungsten, or an alloy thereof, will face towards incident radiation comprising the first wavelength and/or second wavelength of radiation in order to, for example, reflect the first wavelength of radiation.

FIG. 9 is shown by way of example only. For example, in another embodiment (not shown) such a pure molybdenum or tungsten layer or region may be provided on, or constitute, a face of a body of material comprising of substantially pure molybdenum or tungsten or an alloy thereof (i.e. not an alloy containing rhenium), but with added nanoparticles. In another embodiment (not shown) such a pure molybdenum or tungsten (or alloy thereof) layer or region may be provided on, or constitute, a face of a body of material formed from a molybdenum-rhenium alloy with added nanoparticles, or from a tungsten-rhenium alloy with nanoparticles, or from a tungsten-molybdenum-rhenium alloy with nanoparticles as discussed above.

The reflective layer or region shown in and described with reference to FIG. 9 is sometimes referred to as a capping region or layer.

Figure 10:
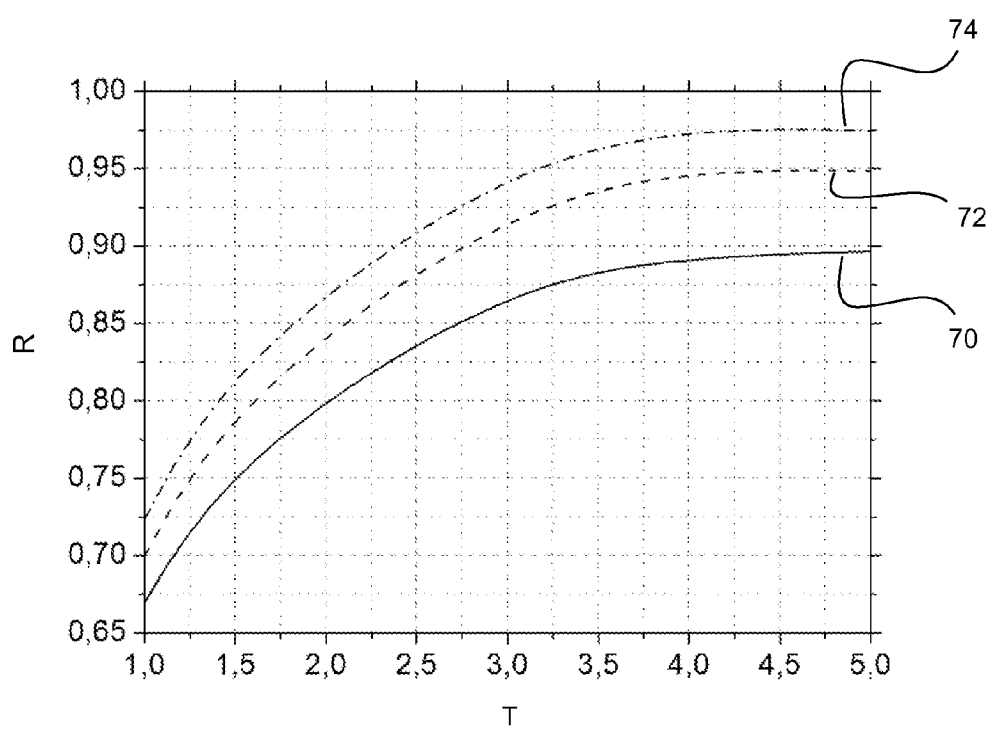
FIG. 10 is a graph depicting a reflection (at 10.6 µm) of the spectral purity filter of embodiments of the present invention, as a function of thickness of those spectral purity filters.

FIG. 10 is a graph showing the fractional reflectivity R of exemplary spectral purity filters as a function of thickness T of each spectral purity filter. Reflectivity is measured at 10.6 µm.

A first series 70 (represented by the solid line) is representative of the reflectivity of a spectral purity filter formed from a body of material comprising of a tungsten-rhenium alloy, and with no pure tungsten reflective layer or region on the face (i.e. no capping layer).

A second series 72 (indicated by the dash line) is representative of the reflectivity of a spectral purity filter formed from a body of material comprising a tungsten-rhenium alloy, and additionally provided with a pure layer or region of tungsten on the face which is 100 nm thick. It can be seen that the reflectivity has increased in comparison with the situation where no such pure tungsten reflective layer was present (i.e. as seen in first series 70).

To demonstrate the trend, a third series 74 (indicated by the dot/dash line) is representative of a spectral purity filter formed from pure tungsten (i.e. no rhenium is present, and no capping layer is present). It can be seen that the reflectivity has increased. However, in this last example, where the spectral purity filter is formed from pure tungsten, the spectral purity filter will not be as thermally resilient as the spectral purity filters described above in embodiments of the present invention.

The spectral purity filters discussed above may be used in a wide variety of applications. For instance, the spectral purity filters may be used in a lithographic apparatus, such as those discussed above in relation to FIGS. 1-3). Alternatively or additionally, a spectral purity filter may be used in or form part of a radiation source or the like.

The spectral purity filters discussed above have been described as being formed from a body of material. That body of material may be a single continuous piece of material, for added thermal resilience (e.g. no added layers or other components). The body of material may be substantially planar, but could also have another shape, for example a curved shape.

For the avoidance of doubt, a spectral purity filter is sometimes given the suffix 'grid' or 'grating' (i.e. is sometimes referred to as a spectral purity filter grating, or as a spectral purity filter grid). Alternatively or additionally, a spectral purity filter is sometimes referred to as a grid filter, or as a grating filter.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A spectral purity filter, comprising:
a body of material, through which a plurality of apertures extend;
the apertures being arranged to suppress radiation having a first wavelength and to allow at least a portion of radiation having a second wavelength to be transmitted through the apertures, the second wavelength of radiation being shorter than the first wavelength of radiation;
the body of material being formed from a tungsten-molybdenum alloy or a molybdenum-rhenium alloy or a tungsten-rhenium alloy or a tungsten-molybdenum-rhenium alloy,
wherein the body of material further comprises a plurality of nanoparticles for increasing a re-crystallization temperature of the body of material as a whole, and wherein the nanoparticles comprise of one or more of: $Al_7O_3$, $HfO_2$, $ZrO_2$, $Y_9O_3$, MgO, $La_7O_3$, $Ce_7O_3$, SrO, and HfC.

2. The spectral purity filter of claim 1, wherein the content of rhenium in the alloy, in atomic percentage, is:
about 0.1% to about 49% for the molybdenum-rhenium alloy;
about 0.1% to about 27% for the tungsten-rhenium alloy; and
about 0.1% to about 49% for the tungsten-molybdenum-rhenium alloy.

3. The spectral purity filter of claim 1, wherein the nanoparticles are distributed in layers within the body of material.

4. The spectral purity filter of claim 1, wherein a face of the body of material through which the apertures extend comprises of, or is provided with, a region or layer that is formed from substantially pure molybdenum or tungsten.

5. The spectral purity filter of claim 4, wherein the face, in use, is configured to face toward incident radiation comprising the first wavelength and/or the second wavelength.

6. The spectral purity filter of claim 1, wherein the second wavelength of radiation has a wavelength that is substantially equal to or shorter than radiation having a wavelength in the EUV part of the electromagnetic spectrum, and/or the second wavelength is in the range of 5 nm-20 nm.

7. The spectral purity filter of claim 6, wherein the second wavelength is in the range of 13 nm-14 nm.

8. A spectral purity filter, comprising:
a body of material, through which a plurality of apertures extend;
the apertures being arranged to suppress radiation having a first wavelength and to allow at least a portion of radiation having a second wavelength to be transmitted through the apertures, the second wavelength of radiation being shorter than the first wavelength of radiation;
the body of material being formed from molybdenum or tungsten, and the body of material further comprising a plurality of nanoparticles for increasing a re-crystallization temperature of the body of material as a whole, wherein the nanoparticles comprise of one or more of: $Al_2O_3$, $HfO_2$, $ZrO_2$, $Y_2O_3$, MgO, $La_2O_3$, $Ce_2O_3$, SrO, and HfC.

9. The spectral purity filter of claim 8, wherein the nanoparticles are distributed in layers within the body of material.

10. The spectral purity filter of claim 8, wherein the molybdenum forms part of a tungsten-molybdenum alloy or a molybdenum-rhenium alloy or a tungsten-molybdenum-rhenium alloy, or wherein the tungsten forms part of a tungsten-molybdenum alloy or a tungsten-rhenium alloy or a tungsten-molybdenum-rhenium alloy.

11. The spectral purity filter of claim 10, wherein the content of rhenium in the alloy, in atomic percentage, is:
about 0.1% to about 49% for the molybdenum-rhenium alloy;
about 0.1% to about 27% for the tungsten-rhenium alloy; and
about 0.1% to about 49% for the tungsten-molybdenum-rhenium alloy.

12. The spectral purity filter of claim 8, wherein a face of the body of material through which the apertures extend comprises of, or is provided with, a region or layer that is formed from substantially pure molybdenum or tungsten.

13. The spectral purity filter of claim 12, wherein the face, in use, is configured to face toward incident radiation comprising the first wavelength and/or the second wavelength.

14. The spectral purity filter of claim 8, wherein the second wavelength of radiation has a wavelength that is substantially equal to or shorter than radiation having a wavelength in the EUV part of the electromagnetic spectrum, and/or the second wavelength is in the range of 5 nm-20 nm.

15. The spectral purity filter of claim 14, wherein the second wavelength is in the range of 13 nm-14 nm.

16. A lithographic apparatus, comprising:
a radiation source configured to generate radiation, the radiation source comprising a spectral purity filter comprising
   a body of material, through which a plurality of apertures extend,
   the apertures being arranged to suppress radiation having a first wavelength and to allow at least a portion of radiation having a second wavelength to be transmitted through the apertures, the second wavelength of radiation being shorter than the first wavelength of radiation,
   the body of material being formed from a tungsten-molybdenum alloy or a molybdenum-rhenium alloy or a tungsten-rhenium alloy or a tungsten-molybdenum-rhenium alloy,
   wherein the body of material further comprises a plurality of nanoparticles for increasing a re-crystallization temperature of the body of material as a whole, and wherein the nanoparticles comprise of one or more of: $Al_2O_3$, $HfO_2$, $ZrO_2$, $Y_2O_3$, MgO, $La_2O_3$, $Ce_2O_3$, SrO, and HfC; and
a projection system configured to project a patterned beam of radiation onto a substrate.

17. A lithographic apparatus, comprising:
a radiation source configured to generate radiation, the radiation source comprising a spectral purity filter, the spectral purity filter comprising
   a body of material, through which a plurality of apertures extend,
   the apertures being arranged to suppress radiation having a first wavelength and to allow at least a portion of radiation having a second wavelength to be transmitted through the apertures, the second wavelength of radiation being shorter than the first wavelength of radiation,
   the body of material being formed from molybdenum or tungsten, and the body of material further comprising a plurality of nanoparticles for increasing a re-crystallization temperature of the body of material as a whole, wherein the nanoparticles comprise of one or more of: $Al_2O_3$, $HfO_2$, $ZrO_2$, $Y_2O_3$, MgO, $La_2O_3$, $Ce_2O_3$, SrO, and HfC; and
a projection system configured to project a patterned beam of radiation onto a substrate.

* * * * *